(12) United States Patent
Zhao et al.

(10) Patent No.: US 10,169,387 B1
(45) Date of Patent: Jan. 1, 2019

(54) SELF-BALANCING TREE DATA STRUCTURE COMPRESSION

(71) Applicants: EMC Corporation, Hopkinton, MA (US); EMC IP Holding Company LLC, Hopkinton, MA (US)

(72) Inventors: Junping Zhao, Beijing (CN); Randall Shain, Wrentham, MA (US); Kevin Xu, Warren, NJ (US); Ricky Sun, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 360 days.

(21) Appl. No.: 15/222,371

(22) Filed: Jul. 28, 2016

(51) Int. Cl.
    *G06F 17/30* (2006.01)
    *H03M 7/30* (2006.01)

(52) U.S. Cl.
    CPC .. *G06F 17/30327* (2013.01); *G06F 17/30371* (2013.01); *H03M 7/30* (2013.01)

(58) Field of Classification Search
    CPC ........ G06F 17/30327; G06F 17/30371; H03M 7/30
    See application file for complete search history.

(56) References Cited

U.S. PATENT DOCUMENTS

| | | | |
|---|---|---|---|
| 6,185,575 B1 * | 2/2001 | Orcutt | G06F 17/30135 |
| 9,696,913 B1 * | 7/2017 | Aron | G06F 3/0611 |
| 2015/0178305 A1 * | 6/2015 | Mueller | G06F 17/30129 707/693 |

* cited by examiner

*Primary Examiner* — Jared M Bibbee
(74) *Attorney, Agent, or Firm* — Ryan, Mason & Lewis, LLP

(57) ABSTRACT

A data element to be inserted into a memory data structure, represented by a key and a value, is received. A target node into which the received data element is to be inserted is determined based on the key of the received data element. A determination is made whether or not the target node is already compressed. An append-write operation to insert the data element into the target node is performed when the target node is already compressed. An evaluation is performed prior to inserting the data element when the target node is not already compressed. An in-place write operation to insert the data element into the uncompressed target node is performed when the evaluation generates a first result. The target node is compressed and then an append-write operation to insert the data element into the compressed target node is performed when the evaluation generates a second result.

20 Claims, 11 Drawing Sheets

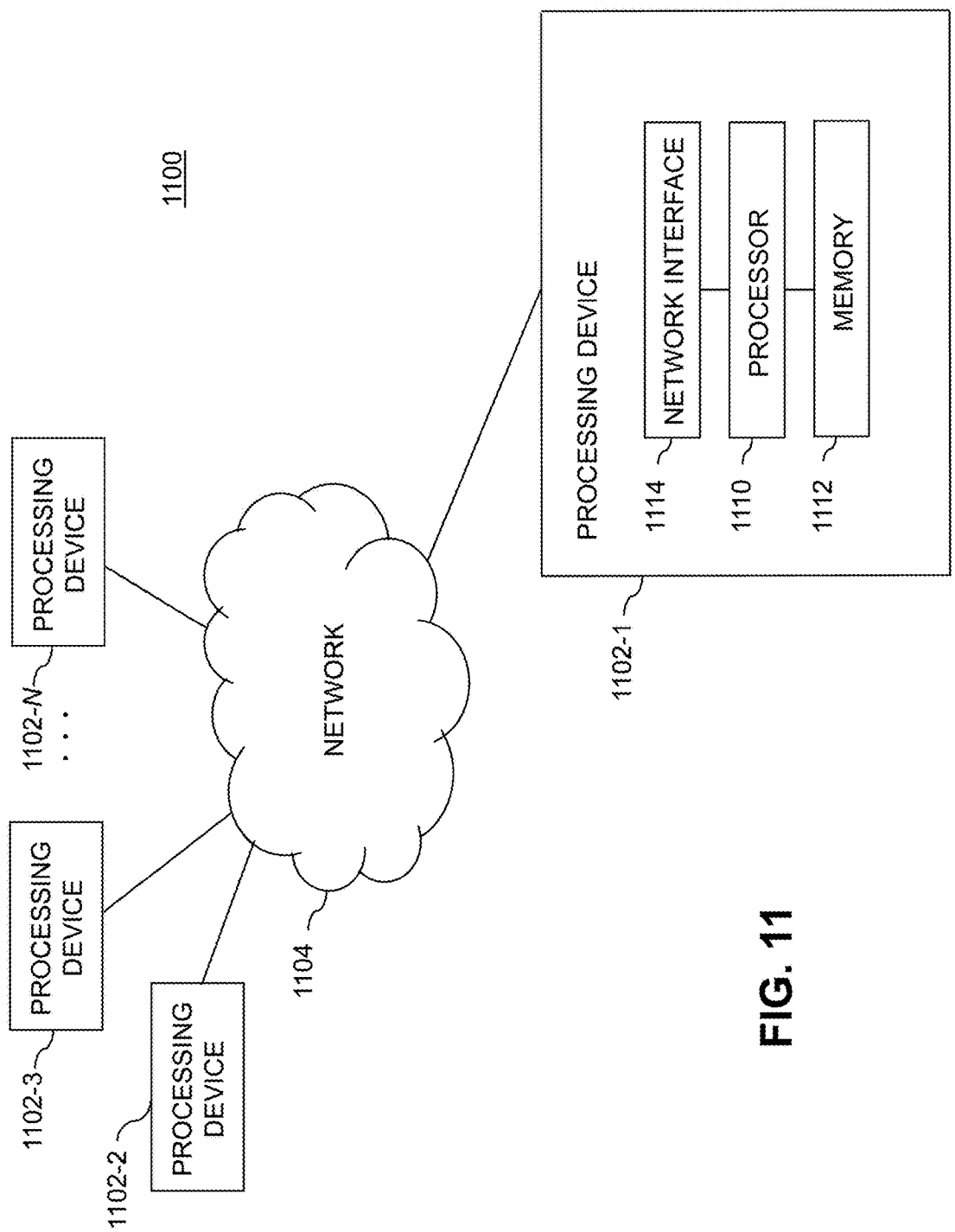

SELF-BALANCING TREE DATA STRUCTURE COMPRESSION

FIELD

The field relates generally to computing environments, and more particularly to management of self-balancing tree data structures used to store data in such computing environments.

BACKGROUND

Computing environments, such as data centers, frequently employ cloud computing platforms, where "cloud" refers to a collective computing infrastructure that implements a cloud computing paradigm. Cloud-based data centers are deployed and managed by cloud service providers, who provide a computing environment for customers (tenants) to run their application programs (e.g. business applications or otherwise). The applications are typically run on one or more computing devices (i.e., host devices or hosts), and write data to and read data from one or more storage devices (e.g., hard disk drives, flash drives, etc.). The storage devices may be remote from the host devices such that they are connected via a communication network. Some or all of the storage devices may be part of the same computing devices that implement the hosts.

However, in computing environments such as those described above as well as others, efficient access to data and/or metadata is highly desirable from a performance perspective. Due to beneficial lookup performance, a self-balancing tree data structure known as B+Tree data structure is a memory structure widely used in file systems, storage, or databases to manage data and/or metadata.

SUMMARY

Embodiments of the invention provide memory management techniques for compression of data structures in computing environments.

For example, in one embodiment, a method of managing a memory data structure in a computing environment comprises the following steps. A data element to be inserted into the memory data structure is received, wherein the data element is represented by a key and a value. A target node in the memory data structure into which the received data element is to be inserted is determined based on the key of the received data element. A determination is made whether or not the target node is already compressed. An append-write operation to insert the data element into the target node is performed when the target node is already compressed. An evaluation is performed prior to inserting the data element when the target node is not already compressed. An in-place write operation to insert the data element into the uncompressed target node is performed when the evaluation generates a first result. The target node is compressed and then an append-write operation to insert the data element into the compressed target node is performed when the evaluation generates a second result. The computing environment is implemented via one or more processing devices operatively coupled via a communication network.

These and other features and advantages of the invention will become more readily apparent from the accompanying drawings and the following detailed description.

BRIEF DESCRIPTION OF THE DRAWINGS

FIG. 11 illustrates a processing platform used to implement a computing environment with self-balancing tree data structure compression, according to an embodiment of the invention.

DETAILED DESCRIPTION

Illustrative embodiments may be described herein with reference to exemplary cloud infrastructure, data repositories, data centers, data processing systems, computing systems, data storage systems and associated servers, computers, storage units and devices and other processing and computing devices. It is to be appreciated, however, that embodiments of the invention are not restricted to use with the particular illustrative system and device configurations shown. Moreover, the phrases "cloud environment," "cloud computing platform," "cloud infrastructure," "data repository," "data center," "data processing system," "computing system," "data storage system," "computing environment," and the like as used herein are intended to be broadly construed, so as to encompass, for example, private and/or public cloud computing or storage systems, as well as other types of systems comprising distributed virtual infrastructure. However, a given embodiment may more generally comprise any arrangement of one or more processing devices.

The B+Tree data structure format, along with its variations, is commonly used in file system/storage, and online transaction processing (OLTP) and non-structured query langauge (NoSQL) databases, typically for metadata storage. B+Tree is a variation of the more general B-tree data structure. In B-trees, internal nodes (i.e., non-leaf nodes) can have a variable number of child nodes (subtrees) within some pre-defined range. When data is inserted or removed from a node, its number of child nodes changes. In order to maintain the pre-defined range, internal nodes may be joined or split. Each internal node contains a number of keys. The keys act as separation values which divide its child nodes (subtrees). In the B+tree data structure variation, copies of the keys are stored in the internal nodes. The keys and records are stored in leaves, and a leaf node may include a pointer to the next leaf node to speed sequential access.

B-tree data structures are frequently built to represent a large existing collection of data. The B-tree is then updated incrementally using standard B-tree operations. One efficient way to construct the initial B-tree is not to insert every element in the initial collection successively, but instead to construct the initial set of leaf nodes directly from the input, then build the internal nodes from these leaf nodes. This approach to B-tree construction is called bulkloading. Initially, every leaf node but the last leaf node has one extra element, which is used to build the internal nodes.

Figures 1A, 1B:
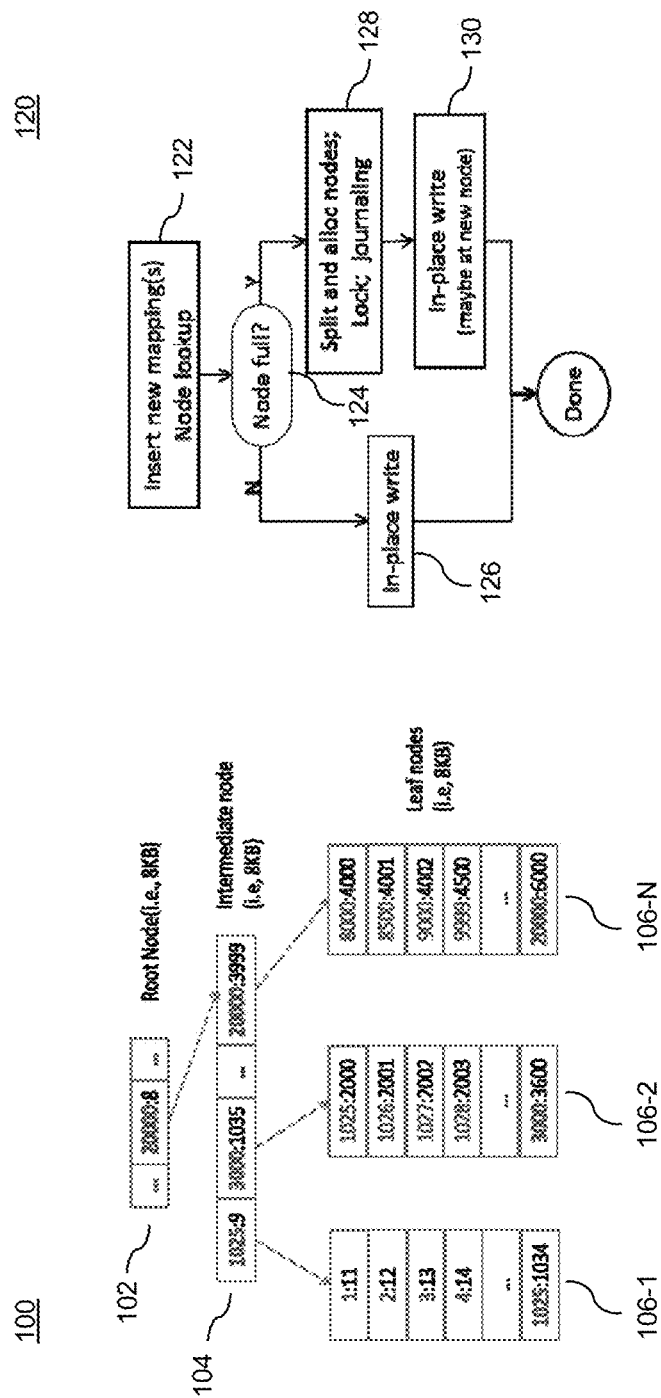
FIG. 1A illustrates a flat mapping layout for a self-balancing tree data structure.
FIG. 1B illustrates update and node split steps usable for the flat mapping layout for a self-balancing tree data structure.

B+Tree data structures are used to manage data and/or metadata using a [key:value] type mapping. Typically, a B+Tree data structure utilizes a flat mapping layout to organize the [key:value] mappings. FIG. 1A illustrates one example mapping layout 100 with a root node 102, intermediate node 104, and N leaf nodes 106-1, 106-2, . . . , 106-N. While such a mapping layout is straightforward, it is realized herein that such layout is not memory efficient as there is ample opportunity to encode or compress the continuous mappings.

In addition, with such a flat mapping layout 100, it is realized herein that there is a performance penalty when updating a B+Tree node as illustrated in FIG. 1B. That is, as shown in flow chart 120, when a new mapping is inserted and existing node lookup is performed (step 122), a determination is made whether or not the subject existing node is full (step 124). When the existing node is not full, an in-place write is performed adding the new mapping to the layout (step 126). However, when the existing node is full, it must split into two nodes to accommodate more mappings, and journaling and costly locking (step 128) are required prior to the in-place write operation (step 130), which causes notable performance downgrade.

Returning to FIG. 1A, note that in root node 102, intermediate node 104 and leaf nodes 106-1, 106-2, . . . , 106-N, the content normally is [key:value] type mappings. Each node usually has a fixed size, e.g., 4 KiloBytes (KB), 8 KB, etc. Intermediate nodes generally point to low level nodes; while leaf nodes usually point to the final value i.e., LBN for storage/database. In B+Tree implementations, leaf nodes may or may not have pointers to child nodes (not shown in FIG. 1A). A new mapping is inserted at the appropriate place ordered by key after node lookup from the root node.

Figure 2:
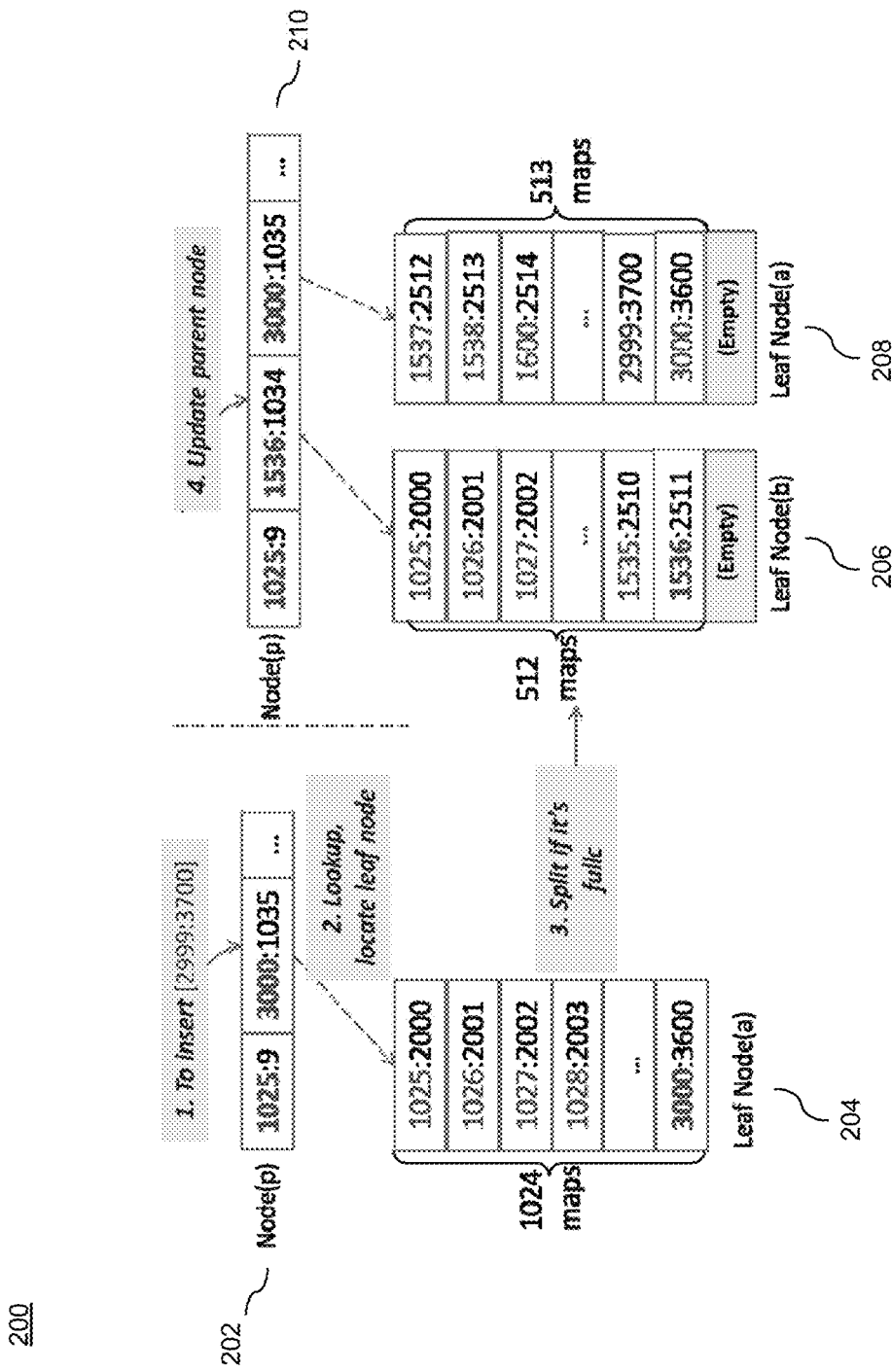
FIG. 2 illustrates an example of update and node split steps for the flat mapping layout for a self-balancing tree data structure.

As further illustrated in example 200 of FIG. 2, a node split is required if the current node is full, i.e., 1024*8B per mapping would fill a 8 KB node. During the split, relevant changes (on the new node, and the parent node) are protected by transaction or journaling. Thus, as shown, a new mapping, [2999:3700], is inserted through the parent node 202. The appropriate leaf node is found, in this case, leaf node 204. Because leaf node 204 is full, the leaf node 204 is split into leaf node 206 and leaf node 208 to accommodate the new mapping (which is inserted into node 208 as shown). The parent node (now denoted as parent node 210) is updated to reflect the split.

It is realized herein that the typical flat [key:value] mapping layout described above in the context of FIGS. 1A, 1B and 2, is not memory efficient and could be improved. For instance, as will be explained in illustrative embodiments, consecutive keys or values could be compacted as a range or extent list to reduce the memory footprint. Consider that tens of millions of mappings likely consume 10+GB (GigaBytes) memory.

Usually when a node becomes full, it suffers a very costly split operation involving: allocating a new node on disk, journaling log flush (since a few metadata elements may have changed, thus consistency is required), exclusive locking of parent node (significant impact), splitting mappings 50/50, and inserting a new node into a parent node and finally unlocking the parent node. These are some of the examples of the challenges for the B+tree data structure especially for write-intensive workloads. It is realized herein that node splitting needs to be reduced.

A B+tree data structure could be compressed by leveraging the consecutive mapping distribution. However, in practice, there are still several significant challenges to resolve before implementing such an approach in production:

1) Running cost versus benefit analysis: systems need a way to evaluate extra central processing unit (CPU) or extra temporary memory against the potential memory reduction.

2) Memory fragmentation challenge: such as after compression, if there is free un-used memory, then when new mappings come in, a new piece of memory is allocated and a memcopy is performed to combine together. This leads to significant memory fragmentation and impacts system-wide memory usage.

3) Performance impact to normal access, i.e., what is the performance penalty if decompression is needed for a read or re-write operation.

Thus, while it is realized herein that to improve B+Tree memory efficiency, compression could be a beneficial technique; simply adopting some existing compression algorithms, such as LZ4 or zlib, does not resolve the several practical challenges mentioned above.

According, illustrative embodiments of the invention prvide a transparent compression methodology that significantly improves B+Tree memory efficiency (e.g., 1-2 orders of magnitude, meaning a 10 GB footprint can now be compressed to less than 512 MegaBytes (MB)). As will be further explained in detail, a system-wide semantic-aware design resolves the above and other challenges and thus fits well into a production computing environment.

Some advantages of the B+Tree data structure compression approach include, but are not limited to:

- A focus on memory structure compression rather than disk compression (although disk compression is supported) means that a B+Tree node maintains a compressed state in-memory. In-memory typically refers to memory local to the CPU of the host device as compared to on disk memory which is typically storage remote from the host device.
- A formula to proactively evaluate gains versus cost, and ensure compression runs on the proper node at the proper time.
- No de-compression needed for any read and write operation due to the compact, self-contained layout with a built-in fine-grained index to provide native read and append-write capabilities.
- Reduced B+Tree node splitting (note that node splitting is a very costly operation due to journaling and heavy locking protocols needed for consistency).
- No memory fragmentation. For example, use page size large enough for memory before and after compression, thus avoiding memory fragmentation
- Transparent inline compression at node granularity, complemented by offline re-compression at node or cross-node. It is understood that "cross-node," as illustratively used here, means across multiple nodes typically at the same level of the tree data structure (e.g., between two or more intermediate nodes, or between two or mode leaf nodes, etc.). Also, the term "inline," as illustratively used herein with regard to data compression, means data compression that is performed on data before or as it is being written to a storage device. In some embodiments, the inline compressed data may not be written to a storage device (on-disk) but rather the inline compressed data may remain in-memory. Inline is also illustratively used to refer to compression that is done before acknowledgement to the application. "Offline," as illustratively used herein, means no compression occurred during the application's normal access (update, for example); rather, compression is scheduled in the background via a pre-defined policy.

It is realized herein that this approach is effective and beneficial when applied to various file system/storage or database computing environments.

Illustrative embodiments of the invention overcome the above and other challenges by providing a B+Tree data structure compression approach that provides system-wide optimizations and thus behaves in a semantic-aware manner, as will be further explained. The approach implements intelligent inline compression with policy driven offline (re-)compression, a unified and self-contained layout (for uncompressed, compressed or re-compressed nodes), and support for native access without de-compression.

Figure 3:
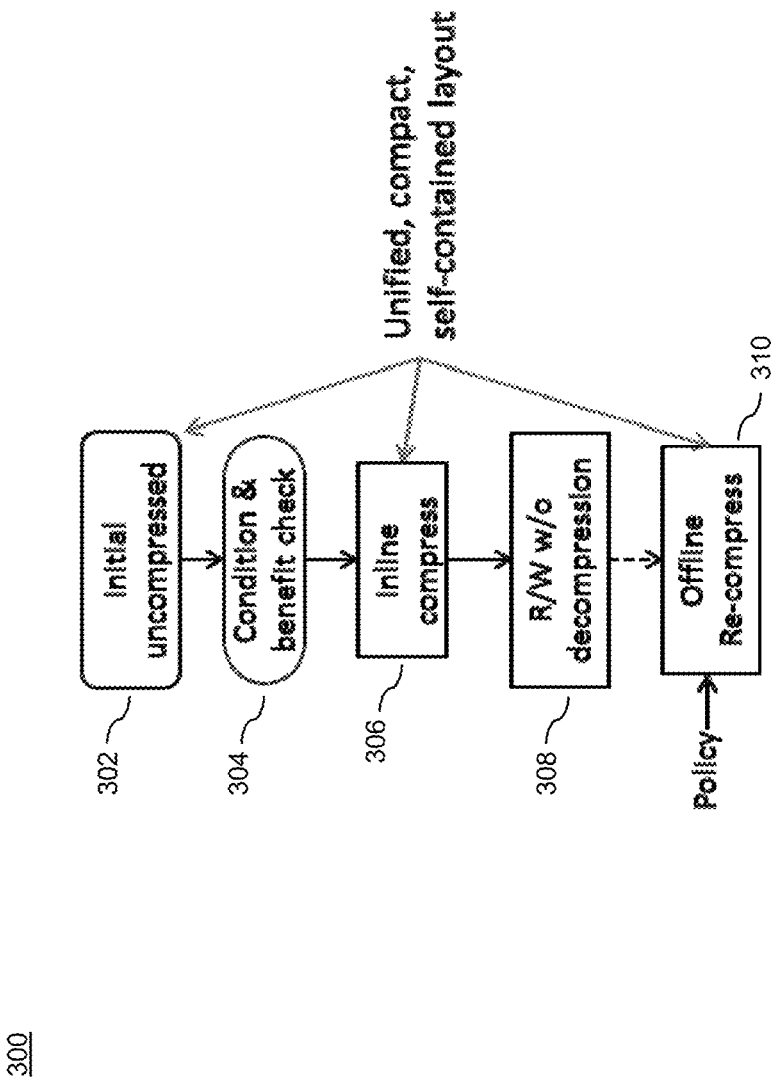
FIG. 3 illustrates general state translations with a unified layout for a self-balancing tree data structure, according to an embodiment of the invention.

FIG. 3 illustrates general state translations with a unified layout for a self-balancing tree data structure, according to an illustrative embodiment. As shown in methodology 300, an uncompressed B+Tree data structure is received in step 302. In step 304, a condition and benefit check is performed. Inline compression is performed in step 306. Subsequent read and write operations are performed without decompression in step 308. Offline re-compression is performed in step 310. Details of these data structure state translations will be described in further detail below.

Inline compression granularity according to illustrative embodiments is node-level. However, it does not necessarily make sense to compress every new mapping immediately. In fact, due to limited mapping count or sparse distribution, such immediate compression may cause more overhead rather than benefit. Thus, illustrative embodiments provide a just-in-time compression with a fast-calculated evaluation formula, which fully considers factors such as current mapping distribution (compressibility), existing memory usage, and potential gains. Thus, compression is only triggered when evaluation passes configurable criteria and guarantees sufficient gains.

Optimizations are highly desired to handle read or write operations after compression, since frequent de-compression degrades performance. To solve this, illustrative embodiments provide a specific layout (per node) and provide read and update capabilities without decompression, as will be further explained.

Illustrative embodiments employ a layout having an internal header with an index, a fixed-length-extent area (for compressed mappings), and an append-update area (for staging, in flat format). With the index, read requests are able to be served natively. With the append-area, new incoming write operations after compression are handled quickly. Once more flat mappings aggregate in the append-area, this condition crosses above the evaluation check threshold, triggering offline re-compression. As is known, an extent is a contiguous area of storage reserved for a data set (i.e., a file in a file system), represented as a range. A main benefit of the extent is realized in storing each range compactly as two numbers, instead of storing every number in the range.

In illustrative embodiments, memory is not frequently freed after compression and then pieces of memory allocated for new mappings. Rather, in illustrative embodiments, large enough memory is used before and after compression to avoid memory fragmentation, such as, e.g., a system page size of greater than or equal to 4 KB. Previously, a node could maintain a fixed number of mappings (e.g., 1024 mappings). In illustrative embodiments, methodology is always using the same (page aligned) node memory to store significantly more mappings, and this is transparent to the parent node (just need to know the child node's max key), and B+Tree existing lookup and hierarchy works as normal.

Mappings are compressed inline at node granularity, and such compression is deferred until given criteria (e.g., node full and evaluation check passed) are met which guarantees solid gains and also significantly reduces node split (avoid journaling and locking so as to improve update performance).

Hereafter, a compressed node could be natively accessed (read or modify) without de-compression (thus avoiding extra memory). Further, background re-compression is supplementary which runs as a daemon with a configurable policy and parameters such as trigger criterion, period, thread, etc. Basically, the daemon could be wakened either by a timer, or by memory pressure, or requested by a user command or a specific node (such as a node that is going to be full shortly).

Figure 4:
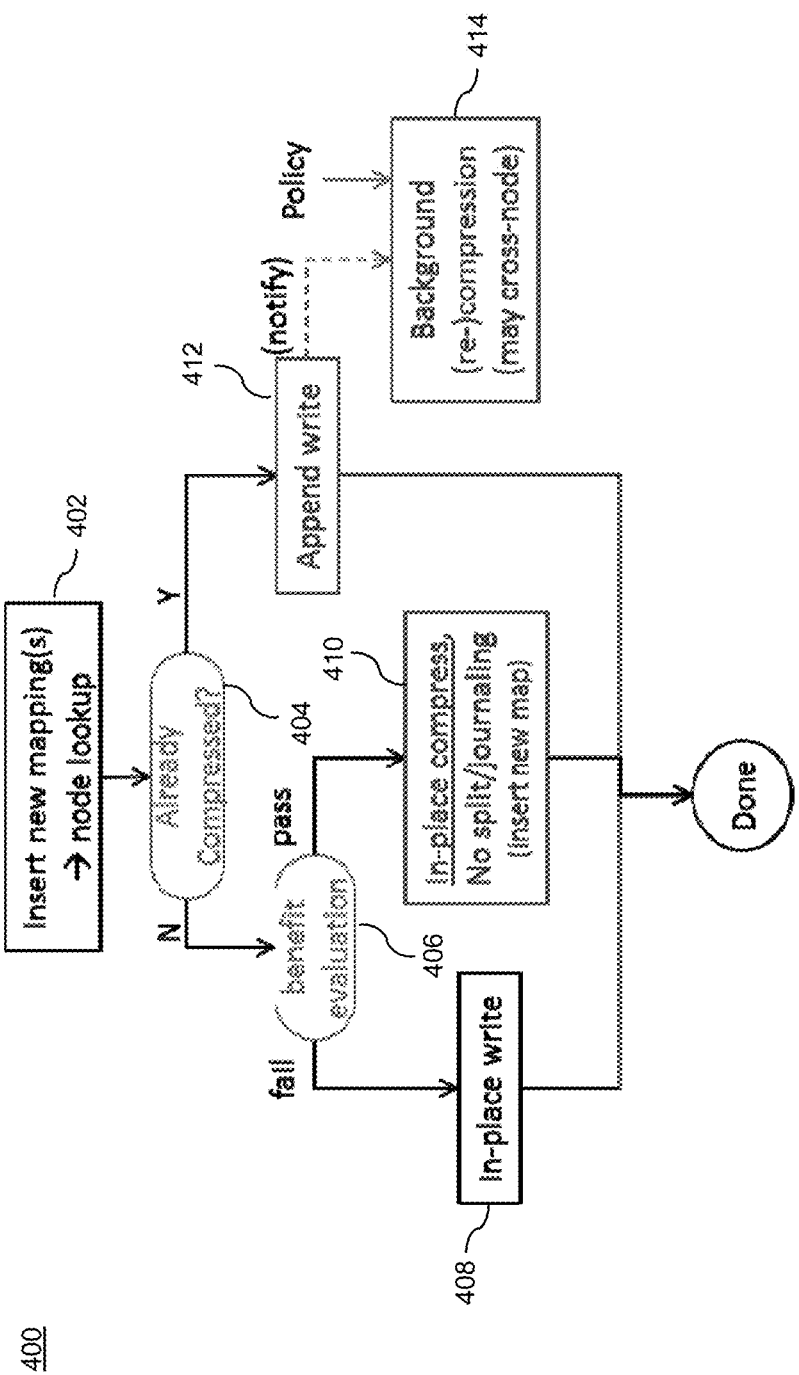
FIG. 4 illustrates a compression workflow for a self-balancing tree data structure, according to an embodiment of the invention.

FIG. 4 illustrates a workflow 400 for inline B+Tree compression according to an illustrative embodiment. As shown, when a new mapping is inserted and existing node lookup is performed (step 402), a determination is made whether or not the node into which the new mapping is to be inserted has already been compressed (step 404). If not, a benefit evaluation is performed (step 406). If the benefit evaluation fails, then an in-place write is performed adding the new mapping to the node (step 408). However, if the benefit evaluation passes, an in-place compression operation is performed on the node (step 410) with no node splitting or journaling, and the new mapping is inserted. Returning to step 404, if the node is already compressed, an append write operation is performed (step 412) to insert the new mapping into the compressed node. Background re-compression is performed in step 414. As illustratively used in FIG. 4 between step 412 and 414, "notify" means to post an event or request to a background re-compression module, then the module would handle the request that launches the background re-compression task immediately. "Policy," as illustratively used with respect to step 414, refers to a configurable policy to auto launch background compression, as is further explained below. Cross-node, as illustratively used in step 414, again means compressing a few neighbor B+Tree nodes into one node to reduce more memory. The justification is that compression running in the background usually has relatively less impact to application latency, so such background compression can perform more comprehensive compression. In contrast, inline compression typically only compresses a specific B+Tree node but not cross-nodes.

Compared to an append-write operation, an in-place write operation means to override an existing value by a new value without allocating new memory or storage. Append-write allocates new memory/storage to store the new input value and updates relevant metadata such as a key/index to point to the new location, then marks the old value as obsolete. Thereafter, a background garage collection task is required to reclaim memory/storage.

Figure 5:
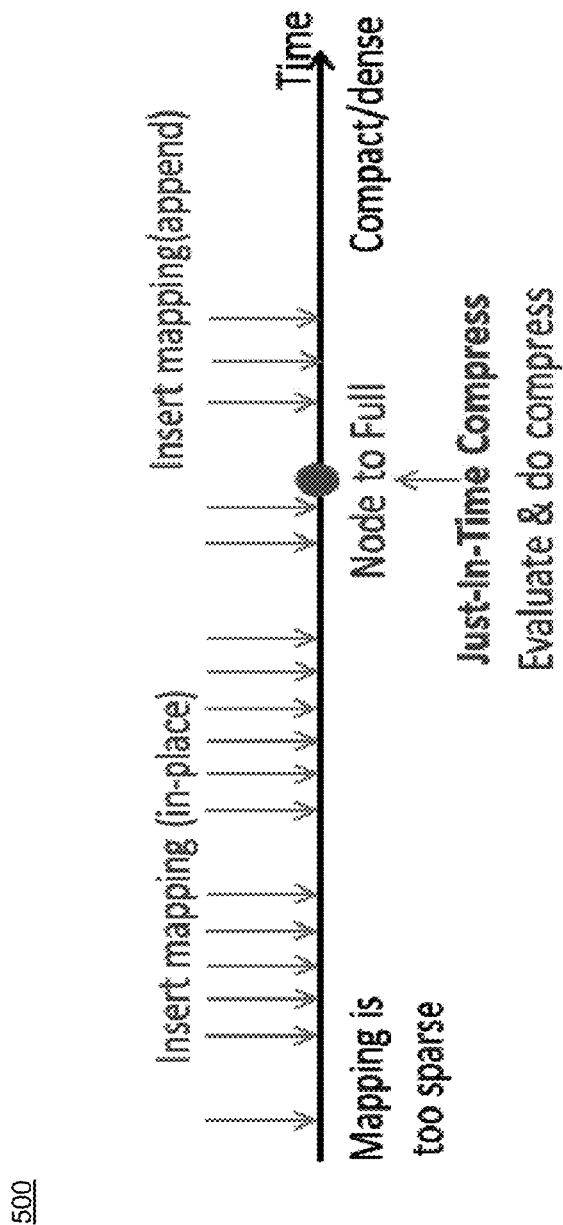
FIG. 5 illustrates an example of benefit evaluation before compression of a self-balancing tree data structure, according to an embodiment of the invention.

FIG. 5 illustrates an example of benefit evaluation before compression, according to an embodiment of the invention. Recall that, as explained above, if compression runs too early, this may lead to a scenario where the negative impact of compression outweighs the benefit. As such, illustrative embodiments implement just-in-time compression as illustrated in timeline 500 of FIG. 5.

One main point to see from timeline 500 is that a new mapping is inserted via an in-place write into the B+Tree layout up until the benefit evaluation determines that compression should be performed. Depending on the setting of the benefit evaluation criteria, compression may occur just before the node is full. After the node is full (or dense) and the B+Tree structure is compressed, then a new mapping is inserted via an append write.

In illustrative embodiments, appropriate timing for just-in-time compression to occur is when the node gets dense enough (with sufficient mappings) or is full. Thus, at this time, the benefit evaluation is performed to determine if compression is deserved. In one embodiment, a benefit evaluation formula is provided for such purpose. The formula evaluates a node's density level or tightness level including factors such as, mappings distribution (how sparse are the mappings) and current memory efficiency (gains after compression). One example formula is as follows:

1. Tightness =

$$\frac{currMemSize}{mapCnt*mapSize} * W(\text{i.e.}, 55) + \frac{MapCnt}{(MaxKey\# - MinKey\# + 1)} * (100 - W)$$

2. Do (Re-) Compress IF Node Tightness>Criterion

The first line of the formula is for computing node tightness which relates to current memory use efficiency. If the node is not yet compressed, currMemSize (defined in layout)=mapCnt*mapSize (i.e., 8B). So the tightness score will be a relatively high score meaning high potential benefit thus deserving of compression.

The second line of the formula relates to the sparseness of the current mappings in the node, e.g., if mappings are completely consecutive (in keys), then mapCnt= (maxKey#-minKey#+1) which leads to a high score and indicates high potential benefit.

Further factors may also be considered including, but not limited to, memory pressure, CPU load, and memory usage prediction. Depending on the system level configuration, the B+Tree may be configured with a memory quota such as the total B+Tree nodes' hard limit is 70% of system memory, and the soft limit is 50%. If actual memory usage reaches towards 50% or higher, which indicates the pressure or urgency, then Criterion (line 2 of formula above) may be adjusted accordingly, so that more B+Tree nodes are compressed to release more memory. Memory usage prediction monitors a B+Tree node memory use trend, based on the trend rather than absolute value, and proactively adjusts parameters such as Criterion.

Figure 6:
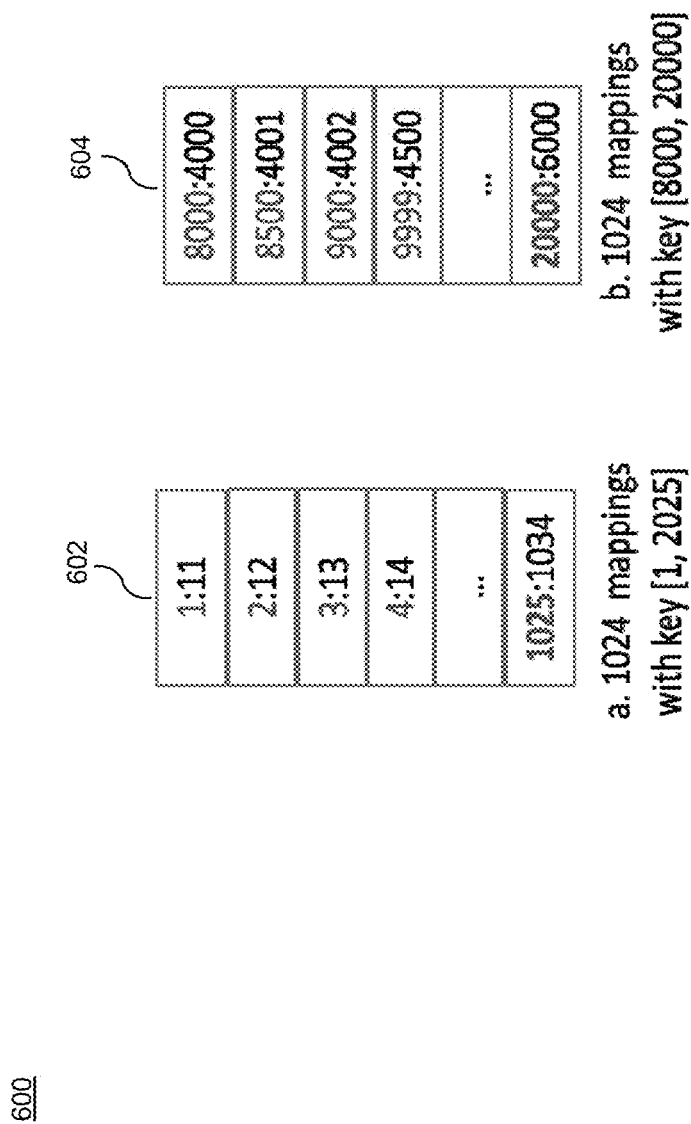
FIG. 6 illustrates comparative nodes of a self-balancing tree data structure, according to an embodiment of the invention.

By way of an example computation using the formula above, and using variable definitions given below, consider the following:

currMemSize: a given B+Tree node's actual occupied memory (total mem size–free mem); it is an element that is stored in the header;

mapCnt: mapping count stored in the specific B+Tree node. e.g., [1, 1024];

mapSize: occupied memory per mapping, e.g., consume 8B (both key and value are 4B) or 16B (both key and value are 8B);

W: a configurable relevant weight or percent e.g., (1, 100);

MaxKey#: the maximum key that is stored in the given B+Tree node;

MinKey#: the minimum key that is stored in the given B+Tree node;

An example computation is given based on the FIG. 6 example 600. Assume there are two leaf nodes, both contain 1024 mapppings (mapCnt), and assume each mapping takes 8B (mapSize), and currMemSize is 8 KB (8192), W=55, then:

$$\text{Node } 602: \frac{8192}{1024*8} * 55 + \frac{1024}{(1025 - 1 + 1)} * (100 - 55) \leftarrow$$

obtain a higher score since the mapping distribution is relatively tight (consecutive mapping keys), hence more potential to compress.

$$\text{Node } 604: \frac{8192}{1024*8} * 55 + \frac{1024}{(20000 - 8000 + 1)} * (100 - 55) \leftarrow$$

obtain lower score since the mapping distribution is relatively sparse (gaps between mapping keys).

It is to be appreciated that all needed parameters can be retrieved from an in-memory B+Tree layout without extra input/output (IO) requests or complex logic. Thus, the benefit evaluation is lightweight and fast. One embodiment defines an adjustable weight and per tree (or system-wide) and criterion per tree (or system-wide). For example, the weight can be normalized to (0, 100], and further various ranges can be defined to guide offline re-compression, such as defining a high tightness range as (75%~100%], a medium tightness range as (50%~75%], and a low tightness range (something below 50%).

For instance, referring again to FIG. 6, both nodes 602 and 604 each have 1024 mappings and no compression yet. According to the above formula, both nodes receive a high score in the first line of the formula, but node 602 receives another high score (1024/1025) for the second line of the formula, and thus is more valuable (deserving) to compress as compared to node 604 which receives a relatively low score of 1024/(20000-8000) for the second line of the formula.

Figure 7:
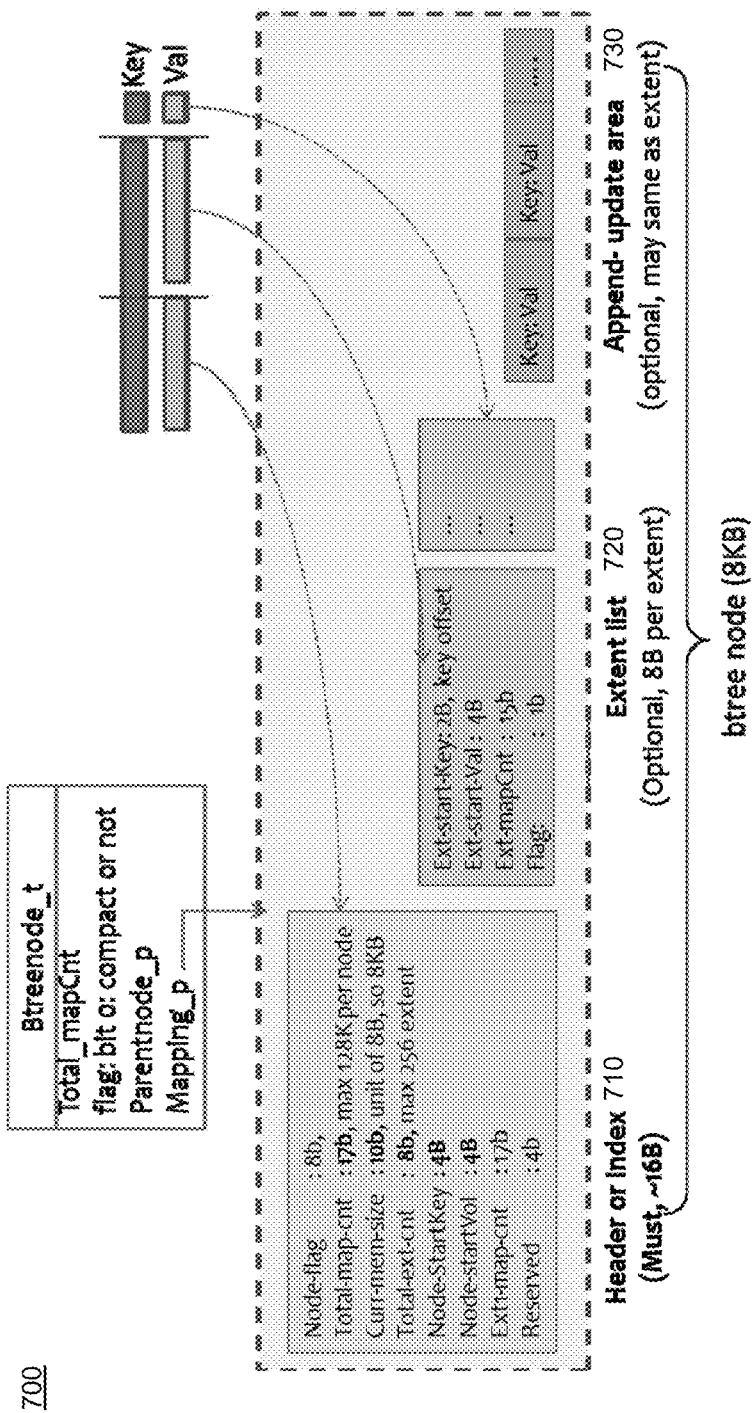
FIG. 7 illustrates a compressed self-balancing tree data structure layout, according to an embodiment of the invention.

Illustrative embodiments provide a unified, self-contained, compact layout, which applies to all cases including non-compressed (initial state), compressed state or re-compressed, in-memory or on-disk. Such layout for a given node comprises three areas as illustrated in FIG. 7. As shown in data structure layout 700 for a given node:

1) Header or index 710: this includes key information such as start [key:value], current memory usage (to know whether the node is full or not), flags such as compression status (0|1), version information to indicate different layout formats or algorithm implementations (layout supports pre-defined difference layout), total mapping count, total extent count, etc. The first extent actually is also included.

2) Extent or range list 720: depending on how compression is performed, here a straightforward and lightweight mechanism is used that compacts consecutive mappings as an extent; note the start-Key is the offset comparing to node or previous extent start-Key. One or more extent lists can co-exist and be ordered by start-Key.

3) Append-area 730: this is a staging area to accommodate any new mappings after compression, those mappings could later be re-compressed.

A fixed size for each sub-area is important for performance such as a binary search. Also, in one embodiment, each extent is exactly the same 8B size as a flat mapping, which enables very compact memory usage.

It is to be appreciated that the fields and bit-size definitions in FIG. 7 are shown as examples. An alternative embodiment may have a different layout such as: keys and values as separate extent lists for high compression (but likely more overhead in read/update).

For a non-compressed node (flag is set), extent area 720 is empty, all mappings are inserted into the append-area 730 (8 KB-16B) at the appropriate place and sorted by key order (done by insert-ordering), much like the flat layout except with a header (so, in this one example, at most 1022 flat mappings can be stored).

With such a layout, the node ideally can cover a significant number of mappings, such as 128*1024 or more (that is 128× more efficiency) depending on the header field setting and how consecutive mappings are configured.

Due to the self-contained, well-designed layout, native read and write access to the compressed layout can be provided without de-compression. Note, for data re-write in file system/storage/database environments, usually the write is just over-written data content rather than updating the mapping in B+Tree (exceptions are content-based or log-structured layout).

1) Read: check header 710 on area start/end location, then read extent 720 via binary search, if not hit, lookup append area 730.

Overall read performance may be the same level as the flat mapping approach since the extent search scope is reduced while append area may need linear search.

2) Insert/update: a new mapping could be inserted in the append-area 730, following the same compression-on-full rule to re-compress if necessary. In many snapshot use cases, insert is on a leaf RW (read/write) map; while a non-leaf usually is RO (read only).

While single mapping insert would be the same level performance, aggregated (batched) mapping insert will be greater as many node splits are reduced and the B+tree width and depth is reduced.

3) Compact/delete: mappings could be marked as deleted (one bit). Alternatively, and more commonly, they are compacted and merged to another B+tree, which involves read and insert mappings (see above).

4) Split: a node has to split if and only if it is full even after (re-)compression. In general, the methodology still follows the existing split routine that a new node is allocated (8 KB), but then the mapping space is split into two parts and their header is updated accordingly. The split is either 50/50, or it can be evaluated making one node compact enough (less updated) and another part sparse enough to abort a new update. However, there will be some locking around splits as in the flat mapping approach.

Figure 8:
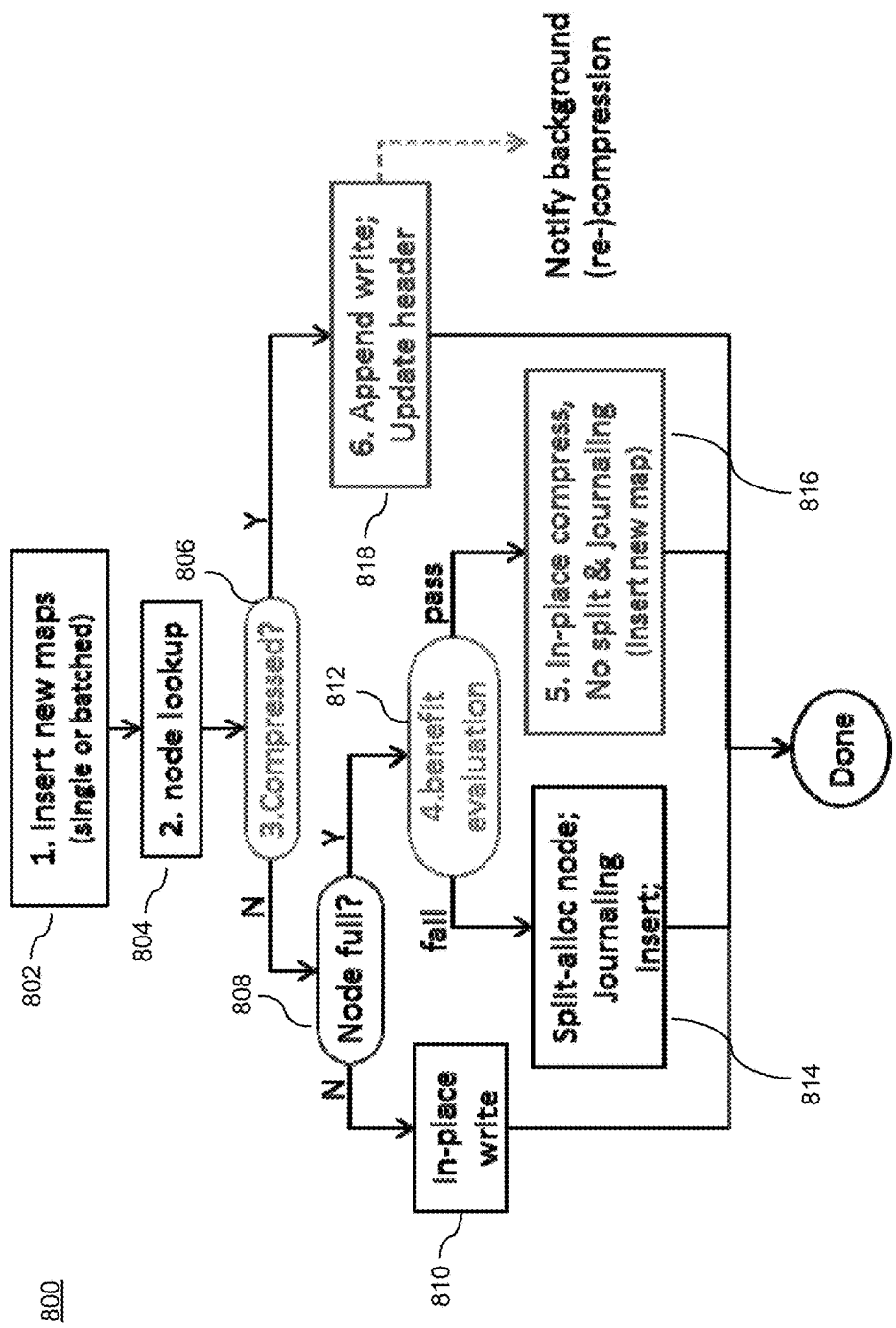
FIG. 8 illustrates a self-balancing tree data structure compression methodology, according to an embodiment of the invention.

In general, for a given node, it is uncompressed (initial state)→compressed (if criteria met)→re-compressed (if criteria met). As methodology 800 in FIG. 8 illustrates:

Steps 1 (802) and 2 (804) insert a new mapping (either single or batched/aggregated mappings) and find the subject node into which the new mapping is to be inserted.

Step 3 (806): methodology checks whether the node has been compressed or not (by looking up its header flag); for compressed node, do append write (step 6; 818) and new mappings are stored at append-area, then update header and methodology is done.

Steps 4-5 (808, 810, 812, 814 and 816): if the node is full and passes the evaluation check (which means it deserves compression), then the methodology changes the existing flat mapping into a compressed layout, and node splitting is avoided (since the compressed node can accommodate more mappings) thus update performance is improved.

Note, since mappings in a B+Tree are ordered by key, in one implementation, extra temporary memory (such as for sorting or copy) is not needed; instead, scan-compression can be performed on the existing node memory in a progressive manner.

Otherwise, if the node is not full or not enough gains are present (evaluation check failed), then the methodology follows the existing method that performs in-place update or split and insert.

Figure 9:
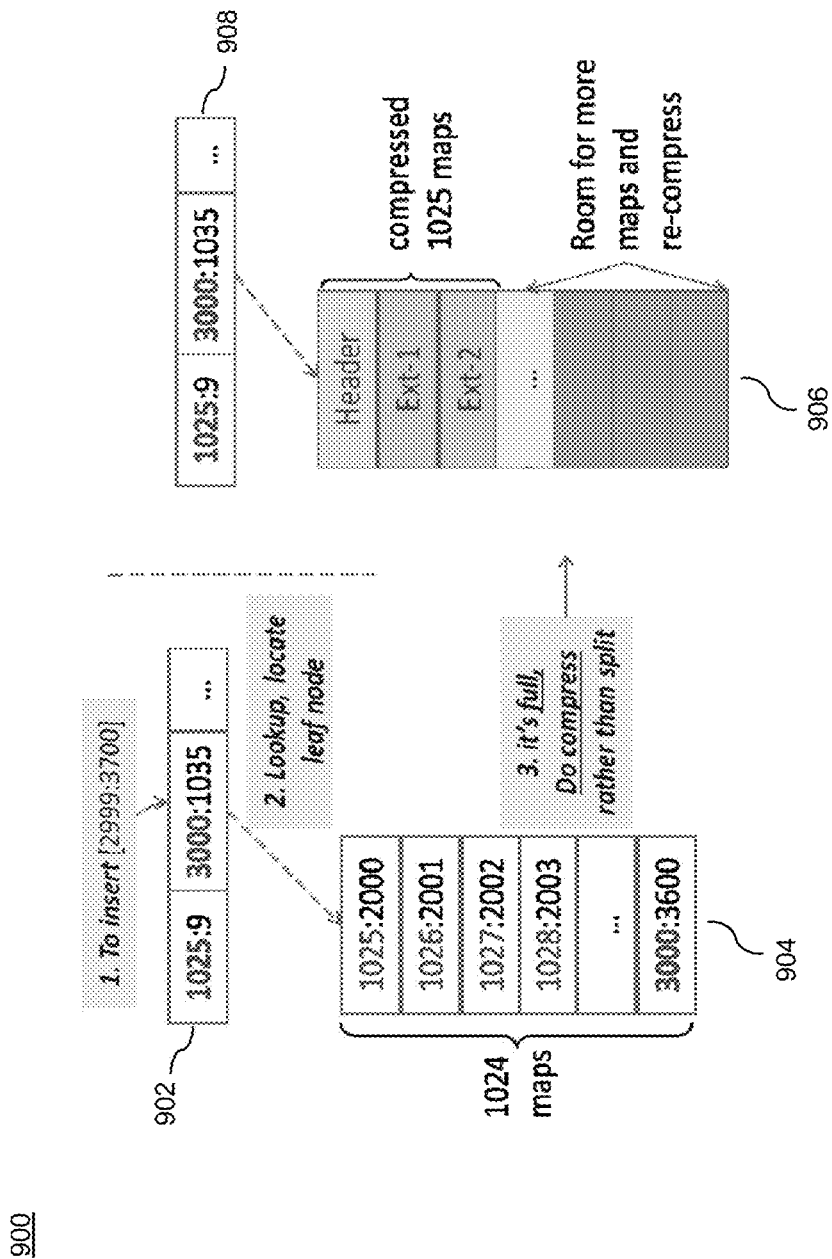
FIG. 9 illustrates an example of inline compression of a self-balancing tree data structure, according to an embodiment of the invention.

FIG. 9 illustrates an example 900 of inline compression whereby root node 902 points to intermediate node 904, which is compressed in accordance with illustrative embodiments resulting in compressed intermediate node 906 with root node 908 denoting the updated root node (which was initially 902).

Offline (re-)compression is scheduled in the background by a single or multiple threads of the CPU of the host device, typically for one of two purposes:

1) Re-compression for attaining a high compression ratio, such as to compact the mappings in append-area, merge neighbor extents, etc 2) Optionally, first-ever compression: as necessary, complementary to inline compression if the node is near full, so the background thread could proactively compress the node.

The background thread could be triggered by configuration criteria such as, but not limited to:

1) Pre-defined timer, either per tree or system-wide;

2) B+Tree memory quota is going to be reached, thus significant memory pressure;

3) Notified by online update such as on specific node if it's going to be full; and 4) Requested by user through CLI, configuration file, RESTAPI, etc.

In illustrative embodiments, background threads scan B+Tree nodes in a least recently used (LRU) manner, and may do so in iterations such as starting from high tightness nodes (which would realize potentially more gains after compression). An advanced policy could be specified such as input information about memory pressure, workload etc., which can be used to adjust relevant parameters such as scan period, thread number, etc.

Figure 10:
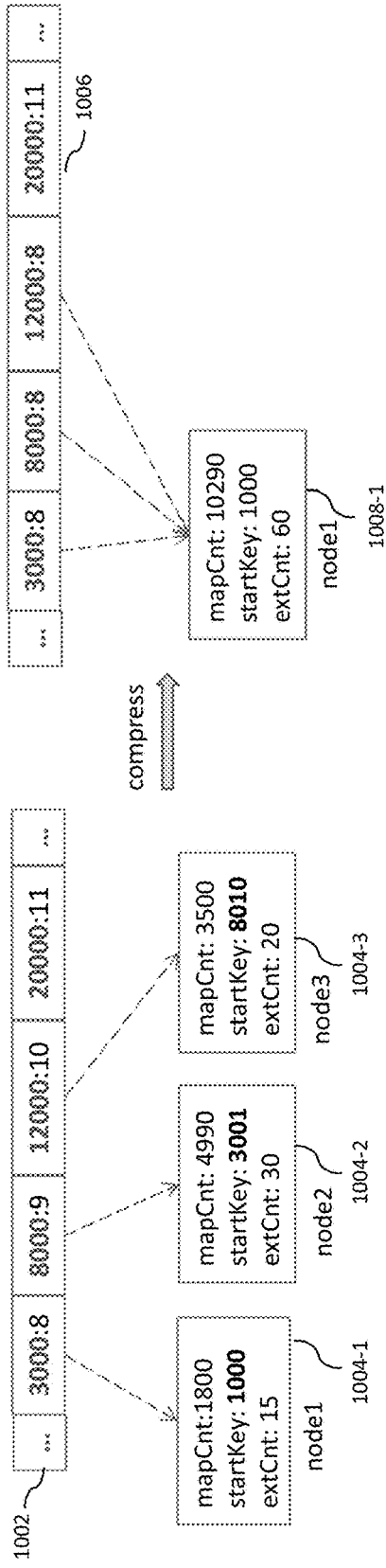
FIG. 10 illustrates neighbor node compression of a self-balancing tree data structure, according to an embodiment of the invention.

Re-compression optionally may combine several neighbor nodes into one node to release more memory as long as the child nodes are consecutive enough and meet configurable criteria, then free some nodes' memory and update the parent node to point to the remaining node as shown in example 1000 of FIG. 10. As shown, a root node 1002 points to intermediate nodes 1004-1, 1004-2, and 1004-3. After re-compression, updated root node 1006 points to intermediate node 1008-1, wherein intermediate node 1008-1 is a combined version of neighboring intermediate nodes 1004-1, 1004-2 and 1004-3. The remaining node (assume use of the first node whose disk address is 8) would accommodate all the mappings with updated header, such as:

total map cnt=sum of (node1·total map cnt+node2·total map cnt+ . . . );

total ext cnt=merged extent lists from (node1, 2, . . . ) cnt; and node startKey and startVal comes from the leftmost node.

In summary, illustrative embodiments provide an effective and creative transparent B+Tree (as well as its variations) compression to significantly improve its memory efficiency. The design features illustratively summarized below resolve drawbacks associated with simple compression which enable the inventive self-balancing tree data structure approach to fit well into a production environment including, but not limited to, file system/storage/snapshot, OLTP DB, NoSQL, etc.:

Proactive benefit evaluation method to guarantee gains outweigh cost;
No de-compression for read and write due to unified, self-contained and compact layout;
No memory fragmentation (e.g., always use page size memory);
Reduction in node splitting and thus improved update performance; and
Transparent inline compression at node granularity, complemented by offline re-compression at node or cross-node.

FIG. 11 illustrates a processing platform used to implement a computing environment with self-balancing tree data structure compression, according to an embodiment of the invention.

As an example of a processing platform on which a computing environment such as a cloud computing platform with self-balancing tree data structure compression functionalities (e.g., FIGS. 1-10) can be implemented is processing platform 1100 shown in FIG. 11. It is to be appreciated that processing platform 1100 may implement the functionalities described herein. For example, the various architectures and methodologies of FIGS. 1-10 can be implemented in processing platform 1100.

The processing platform 1100 in this embodiment comprises a plurality of processing devices, denoted 1102-1, 1102-2, 1102-3, . . . 1102-N, which communicate with one another over a network 1104. It is to be appreciated that the methodologies described herein may be executed in one such processing device 1102, or executed in a distributed manner across two or more such processing devices 1102. It is to be further appreciated that a server, a client device, a computing device or any other processing platform element may be viewed as an example of what is more generally referred to herein as a "processing device." As illustrated in FIG. 11, such a device generally comprises at least one processor and an associated memory, and implements one or more functional modules for instantiating and/or controlling features of systems and methodologies described herein. Multiple elements or modules may be implemented by a single processing device in a given embodiment.

The processing device 1102-1 in the processing platform 1100 comprises a processor 1110 coupled to a memory 1112. The processor 1110 may comprise a microprocessor, a microcontroller, an application-specific integrated circuit (ASIC), a field programmable gate array (FPGA) or other type of processing circuitry, as well as portions or combinations of such circuitry elements. Components of systems as disclosed herein can be implemented at least in part in the form of one or more software programs stored in memory and executed by a processor of a processing device such as processor 1110. Memory 1112 (or other storage device) having such program code embodied therein is an example of what is more generally referred to herein as a processor-readable storage medium. Articles of manufacture comprising such processor-readable storage media are considered embodiments of the invention. A given such article of manufacture may comprise, for example, a storage device such as a storage disk, a storage array or an integrated circuit containing memory. The term "article of manufacture" as used herein should be understood to exclude transitory, propagating signals.

Furthermore, memory 1112 may comprise electronic memory such as random access memory (RAM), read-only memory (ROM) or other types of memory, in any combination. The one or more software programs when executed by a processing device such as the processing device 1102-1 causes the device to perform functions associated with one or more of the components/steps of system/methodologies in FIGS. 1-10. One skilled in the art would be readily able to implement such software given the teachings provided herein. Other examples of processor-readable storage media embodying embodiments of the invention may include, for example, optical or magnetic disks.

Processing device 1102-1 also includes network interface circuitry 1114, which is used to interface the device with the network 1104 and other system components. Such circuitry may comprise conventional transceivers of a type well known in the art.

The other processing devices 1102 (1102-2, 1102-3, . . . 1102-N) of the processing platform 1100 are assumed to be configured in a manner similar to that shown for computing device 1102-1 in the figure.

The processing platform 1100 shown in FIG. 11 may comprise additional known components such as batch processing systems, parallel processing systems, physical machines, virtual machines, virtual switches, storage volumes, etc. Again, the particular processing platform shown in this figure is presented by way of example only, and the system shown as 1100 in FIG. 11 may include additional or alternative processing platforms, as well as numerous distinct processing platforms in any combination.

Also, numerous other arrangements of servers, clients, computers, storage devices or other components are possible in processing platform 1100. Such components can communicate with other elements of the processing platform 1100 over any type of network, such as a wide area network (WAN), a local area network (LAN), a satellite network, a telephone or cable network, or various portions or combinations of these and other types of networks.

It should again be emphasized that the above-described embodiments of the invention are presented for purposes of illustration only. Many variations may be made in the particular arrangements shown. For example, although described in the context of particular system and device configurations, the techniques are applicable to a wide variety of other types of data processing systems, processing devices and distributed virtual infrastructure arrangements (e.g., using virtual machines and/or containers). In addition, any simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:
1. A method of managing a memory data structure in a computing environment, comprising:
receiving a data element to be inserted into the memory data structure, wherein the data element is represented by a key and a value;

determining a target node in the memory data structure into which the received data element is to be inserted based on the key of the received data element;
determining whether or not the target node is already compressed;
performing an append-write operation to insert the data element into the target node when the target node is already compressed;
performing an evaluation prior to inserting the data element when the target node is not already compressed;
performing an in-place write operation to insert the data element into the uncompressed target node when the evaluation generates a first result; and
compressing the target node and then performing an append-write operation to insert the data element into the compressed target node when the evaluation generates a second result;
wherein the computing environment is implemented via one or more processing devices operatively coupled via a communication network.

2. The method of claim 1, wherein the memory data structure is a self-balancing tree data structure.

3. The method of claim 2, wherein the self-balancing tree data structure is a B-tree type data structure.

4. The method of claim 1, wherein the data element to be inserted is a key-value type mapping.

5. The method of claim 1, wherein the evaluation generates a score based on a current memory use efficiency of the target node.

6. The method of claim 1, wherein the evaluation generates a score based on a current distribution of data elements in the target node.

7. The method of claim 1, wherein a layout of the memory data structure for the target node comprises a header section, an extent list section, and an append-update section.

8. The method of claim 7, wherein the header section comprises one or more of: a start key and a start value; version information; a current memory usage value; a compression status indicator; a total data element count; and a total extent count.

9. The method of claim 7, wherein the extent section comprises at least one extent list representing compressed data elements ordered by start keys.

10. The method of claim 7, wherein the append-update section comprises uncompressed data elements ordered by start keys.

11. The method of claim 1, further comprising:
receiving one of a read request and a write request for the target node; and
servicing the request without decompressing data elements in the target node.

12. The method of claim 1, wherein the step of compressing the target node further comprises applying just-in-time compression.

13. The method of claim 12, wherein initiation of the just-in-time compression is based on the evaluation.

14. The method of claim 13, wherein just-in-time compression is initiated when the target node has reached or is near its memory capacity.

15. The method of claim 1, wherein the target node is the same memory page size as one or more other nodes in the data structure.

16. The method of claim 1, further comprising splitting the target node into multiple nodes prior to inserting the data element when the evaluation generates a third result.

17. The method of claim 16, further comprises inserting the data element into one of the multiple nodes.

18. The method of claim 1, further comprising re-compressing the target node offline to at least one of: compress uncompressed data elements; and merge multiple compressed data elements.

19. A system for managing a memory data structure in a computing environment, the system comprising:
at least one processor, coupled to a memory, and configured to:
receive a data element to be inserted into the memory data structure, wherein the data element is represented by a key and a value;
determine a target node in the memory data structure into which the received data element is to be inserted based on the key of the received data element;
determine whether or not the target node is already compressed;
perform an append-write operation to insert the data element into the target node when the target node is already compressed;
perform an evaluation prior to inserting the data element when the target node is not already compressed;
perform an in-place write operation to insert the data element into the uncompressed target node when the evaluation generates a first result; and
compress the target node and then performing an append-write operation to insert the data element into the compressed target node when the evaluation generates a second result.

20. An article of manufacture for managing a memory data structure in a computing environment, the article of manufacture comprising a processor-readable storage medium having encoded therein executable code of one or more software programs, wherein the one or more software programs when executed by at least one processing device implement the steps of:
receiving a data element to be inserted into the memory data structure, wherein the data element is represented by a key and a value;
determining a target node in the memory data structure into which the received data element is to be inserted based on the key of the received data element;
determining whether or not the target node is already compressed;
performing an append-write operation to insert the data element into the target node when the target node is already compressed;
performing an evaluation prior to inserting the data element when the target node is not already compressed;
performing an in-place write operation to insert the data element into the uncompressed target node when the evaluation generates a first result; and
compressing the target node and then performing an append-write operation to insert the data element into the compressed target node when the evaluation generates a second result.

* * * * *